United States Patent
Chen

(10) Patent No.: US 7,714,618 B2
(45) Date of Patent: May 11, 2010

(54) OUTPUT DRIVER CIRCUIT WITH OUTPUT PRESET CIRCUIT AND CONTROLLING METHOD THEREOF HAVING LOWER POWER CONSUMPTION

(75) Inventor: Yunghsu Chen, Hsinchu (TW)

(73) Assignee: Macronix International Co. Ltd, Hsinchu (TW)

( * ) Notice: Subject to any disclaimer, the term of this patent is extended or adjusted under 35 U.S.C. 154(b) by 39 days.

(21) Appl. No.: 11/955,510

(22) Filed: Dec. 13, 2007

(65) Prior Publication Data

US 2009/0153184 A1 Jun. 18, 2009

(51) Int. Cl.
*H03K 19/094* (2006.01)

(52) U.S. Cl. .............. 326/87; 326/86; 327/112

(58) Field of Classification Search ............ 326/30, 326/56–58, 82–83, 86–87, 93, 95–98; 327/108–112
See application file for complete search history.

(56) References Cited

U.S. PATENT DOCUMENTS

| | | | | |
|---|---|---|---|---|
| 4,604,731 A | * | 8/1986 | Konishi | 365/189.05 |
| 4,697,107 A | * | 9/1987 | Haines | 326/60 |
| 4,992,677 A | | 2/1991 | Ishibashi et al. | |
| 5,285,117 A | * | 2/1994 | Furutani | 326/21 |
| 5,382,847 A | * | 1/1995 | Yasuda | 326/68 |
| 5,532,961 A | * | 7/1996 | Mori et al. | 365/189.15 |
| 6,201,743 B1 | * | 3/2001 | Kuroki | 365/194 |
| 6,225,824 B1 | * | 5/2001 | Madhu et al. | 326/58 |
| 6,380,758 B1 | * | 4/2002 | Hsu et al. | 326/30 |
| 6,940,321 B2 | * | 9/2005 | Heo et al. | 327/112 |

\* cited by examiner

*Primary Examiner*—James H. Cho
*Assistant Examiner*—Jason Crawford
(74) *Attorney, Agent, or Firm*—Volpe and Koenig, P.C.

(57) ABSTRACT

The configurations of an output preset circuit for an output driver circuit and the controlling methods thereof are provided. The proposed output preset circuit includes a latch generating an latch output signal and a pull-up circuit receiving an preset enable signal and the latch output signal, in which the pull-up circuit increases an output voltage of the output driver circuit from a ground level to a first level when the preset enable signal is at a low level and the latch output signal is at the high level.

17 Claims, 6 Drawing Sheets

US 7,714,618 B2

OUTPUT DRIVER CIRCUIT WITH OUTPUT PRESET CIRCUIT AND CONTROLLING METHOD THEREOF HAVING LOWER POWER CONSUMPTION

FIELD OF THE INVENTION

The present invention relates to an output driver circuit such as an output buffer circuit. More particularly, the present invention relates to an output driver circuit with an output preset circuit having lower power consumption.

BACKGROUND OF THE INVENTION

Using an output driver circuit such as an output buffer circuit having an output preset circuit in an integrated circuit for driving an output data is quite common nowadays. For example, please refer to FIG. 1, it shows a schematic circuit diagram of an output preset circuit for an output buffer circuit as disclosed by Ishibashi et al. in the U.S. Pat. No. 4,992,677. In FIG. 1, the output preset circuit includes two voltage references (VH and VL), two differential amplifiers (Op1 and OP2), two NMOS (M1 and M2) and a capacitor C (an output load), and a terminal of each of VH, VL, M2 and C is connected to a ground. VH, VL, OP1 and OP2 are used to detect the output level of a voltage of C, and M1 and M2 are employed to preset the voltage of C to VH or VL. M2 is turned on and M1 is turned off to pull low the voltage of C to VH when the voltage of C is higher than VH, and M1 is turned on and M2 is turned off to pull up the voltage of C to VL when a voltage of C is lower than VL.

The main drawbacks of the output preset circuit as shown in FIG. 1 are that the two differential amplifiers OP1 and OP2 are complex in their interior configurations and cause higher power consumptions, and also two extra voltage references VH and VL are generated. Although, this output preset circuit does have the advantages of having the high read out speed and the low switching noise.

Facing the challenges of the energy crisis and the global warming nowadays and coping with the trend of having higher density of electronic elements and lower power consumptions in an IC, the purpose of the present invention is to find an output preset circuit with the advantages of having high read out speed, low switching noise and lower power consumption.

Keeping the drawbacks of the prior arts in mind, the applicant proposes an output driver circuit with an output preset circuit and controlling method thereof having lower power consumption.

SUMMARY OF THE INVENTION

It is therefore an object of the present invention to provide an output driver circuit such as an output buffer circuit with an output preset circuit having high read out speed, low switching noise and lower power consumption.

According to the first aspect of the present invention, an output preset circuit for an output buffer includes a latch having a first input terminal receiving a power on reset signal, a second input terminal receiving a voltage of the output buffer and an output terminal generating a latch output signal, in which the latch output signal is initialized into a high level through a trigger of the activated power on reset signal, and an output preset device including a pull-up circuit receiving a preset enable signal and the latch output signal, in which the pull-up circuit increases the voltage of the output buffer from a ground level to a first level when the preset enable signal is active and the latch output signal is at the high level, and a pull-low circuit receiving the preset enable signal and the latch output signal, in which the pull-low circuit decreases the voltage of the output buffer from a power voltage level to a second level when the preset enable signal is active and the latch output signal is at the low level.

Preferably, the output buffer further connects an output load and includes an output driver, the latch further includes a third input terminal receiving an internal output enable signal, and the output load has a first terminal and a second terminal coupled to a ground.

Preferably, the pull-up circuit includes a first inverter having an input terminal receiving the preset enable signal and an output terminal, a NAND gate having a first input terminal coupled to the output terminal of the first inverter, a second input terminal receiving the latch output signal and an output terminal, a second inverter having an input terminal coupled to the output terminal of the NAND gate and an output terminal, and a first switch having a first terminal receiving a power voltage, a second terminal coupled to the first terminal of the output load and a control terminal coupled to the output terminal of the second inverter.

Preferably, the pull-low circuit includes a NOR gate having a first input terminal receiving the preset enable signal, a second input terminal receiving the latch output signal, and an output terminal, a third inverter having an input terminal coupled to the output terminal of the NOR gate and an output terminal, and a second switch having a first terminal coupled to the first terminal of the output load, a second terminal coupled to the ground and a control terminal coupled to the output terminal of the third inverter.

Preferably, the first switch is an NMOS, the second switch is a PMOS, the NMOS is turned on when the preset enable signal is active and the latch output signal is at the high level, the PMOS is turned on when the preset enable signal is active and the latch output signal is at the low level, the first level equals to a difference between the power voltage and a threshold voltage of the NMOS, and the second level equals to a threshold voltage of the PMOS.

Preferably, the output driver causes a voltage of the output load to increase from the first level to the power voltage level when the preset enable signal is inactive, the latch output signal is at the high level, and the internal output enable signal is active, and the output driver causes the voltage of the output load to decrease from the second level to the ground level when the preset enable signal is inactive, the latch output signal is at the low level, and the internal output enable signal is active.

Preferably, the latch output signal at the high level is switched to the low level when the voltage of the output load reaches the power voltage level and the internal output enable signal is active, and the latch output signal at the low level is switched to the high level when the voltage of the output load reaches the ground level and the internal output enable signal is active.

Preferably, the output driver outputs a data via the output load, and the preset enable signal goes from inactive to active when an external output enable signal goes low, maintains at active for a predetermined time period, and goes back to inactive after that time period so as to preset the voltage of the output load.

Preferably, the output buffer further connects an output load, the latch further includes a third input terminal receiving an internal output enable signal, and the output load has a first terminal and a second terminal coupled to a ground.

Preferably, the pull-up circuit includes an AND gate having an enable terminal receiving an preset enable signal, an input terminal receiving the latch output signal and an output terminal, a first switch having a first terminal receiving a power voltage, a second terminal coupled to the first terminal of the output load and a control terminal coupled to the output terminal of the AND gate.

Preferably, the pull-low circuit includes an OR gate having a first input terminal receiving the preset enable signal, a second input terminal receiving the latch output signal and an output terminal, a second switch having a first terminal coupled to the first terminal of the output load, a second terminal coupled to the ground and a control terminal coupled to the output terminal of the OR gate.

Preferably, the output buffer further comprises an output driver causing a voltage of the output load to increase from the first level to the power voltage level when the preset enable signal is inactive, the latch output signal is at the high level, and the internal output enable signal is active, and the output driver causes the voltage of the output load to decrease from the second level to the ground level when the preset enable signal is inactive, the latch output signal is at the low level, and the internal output enable signal is active.

According to the second aspect of the present invention, a controlling method for an output driver circuit, in which the output driver circuit connects an output load and includes an output preset circuit having a latch, and the latch generates an output signal, includes the steps of: (a) activating a preset enable signal so as to preset a voltage of the output load to be one of a first level increased from a ground level and a second level decreased from a power voltage level; (b) increasing the voltage of the output load to a high level when the output signal of latch is at the high level; and (c) decreasing the voltage of the output load to a low level when the output signal of latch is at the low level.

Preferably, the controlling method further includes a step of: (d) generating one of a first status that the voltage of the output load is increased from the first level to the power voltage level when the preset enable signal is inactive, the latch output signal is at a high level, and an internal output enable signal receiving by the latch is active and a second status that the voltage of the output load is decreased from the second level to the ground level when the preset enable signal is inactive, the latch output signal is at a low level, and the internal output enable signal is active.

Preferably, the step (d) further includes the steps of: (d1) switching the latch output signal from the high level to the low level when the voltage of the output load reaches the power voltage level and the internal output enable signal is active; and (d2) switching the latch output signal from the low level to the high level when the voltage of the output load reaches the ground level and the internal output enable signal is active.

Preferably, the output preset circuit further includes an output preset device having a pull-up circuit and a pull-low circuit, and the step (a) further includes the steps of: (a1) switching the preset enable signal from inactive to active when an external output enable signal goes low, maintains at active for a predetermined time period, and goes back to inactive after that time period so as to preset the voltage of the output load; (a2) turning the first switch on and the second switch off when the latch output signal is at the high level such that the voltage of the output load is increased from the ground level to the first level; and (a3) turning the first switch off and the second switch on when the latch output signal is at the low level such that the voltage of the output load is decreased from the power voltage level to the second level.

Preferably, the first switch is an NMOS, the second switch is a PMOS, the first level equals to a difference between the power voltage and a threshold voltage of the NMOS, and the second level equals to a threshold voltage of the PMOS.

The present invention may best be understood through the following descriptions with reference to the accompanying drawings, in which:

DETAILED DESCRIPTION OF THE PREFERRED EMBODIMENT

Figure 1:
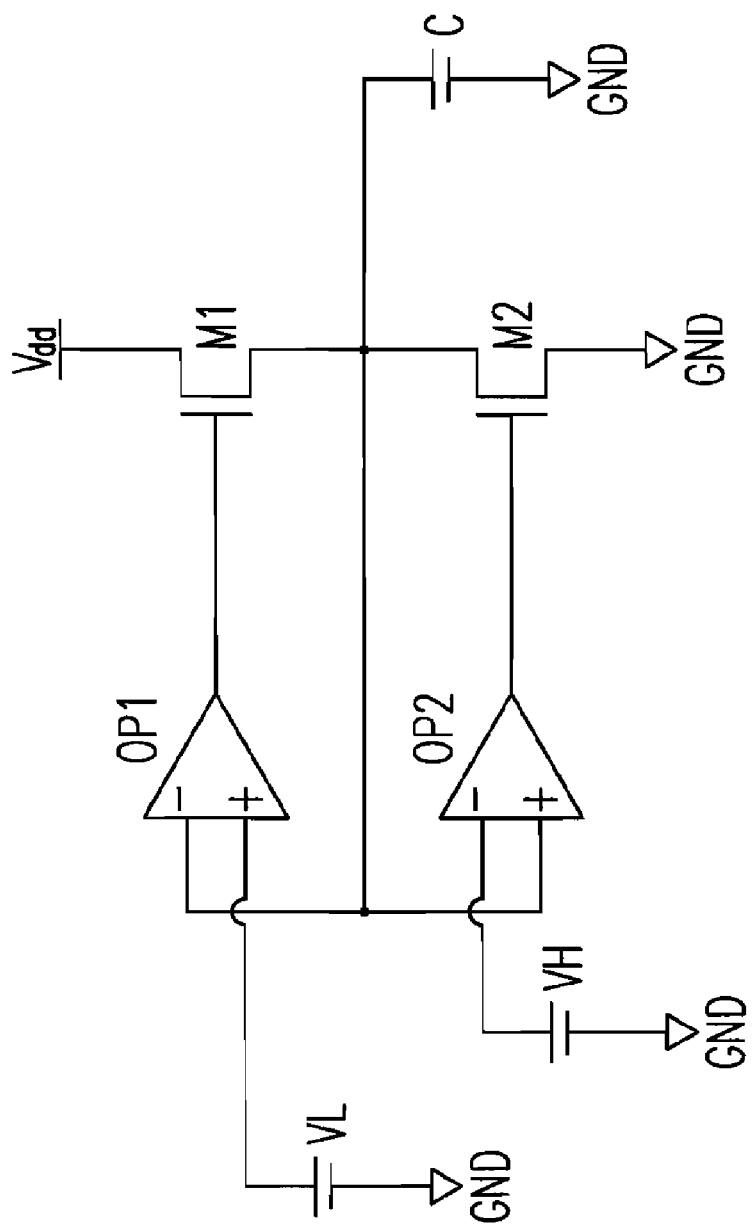
FIG. 1 shows a schematic circuit diagram of an output preset circuit for an output buffer circuit in the prior art.
Figure 2:
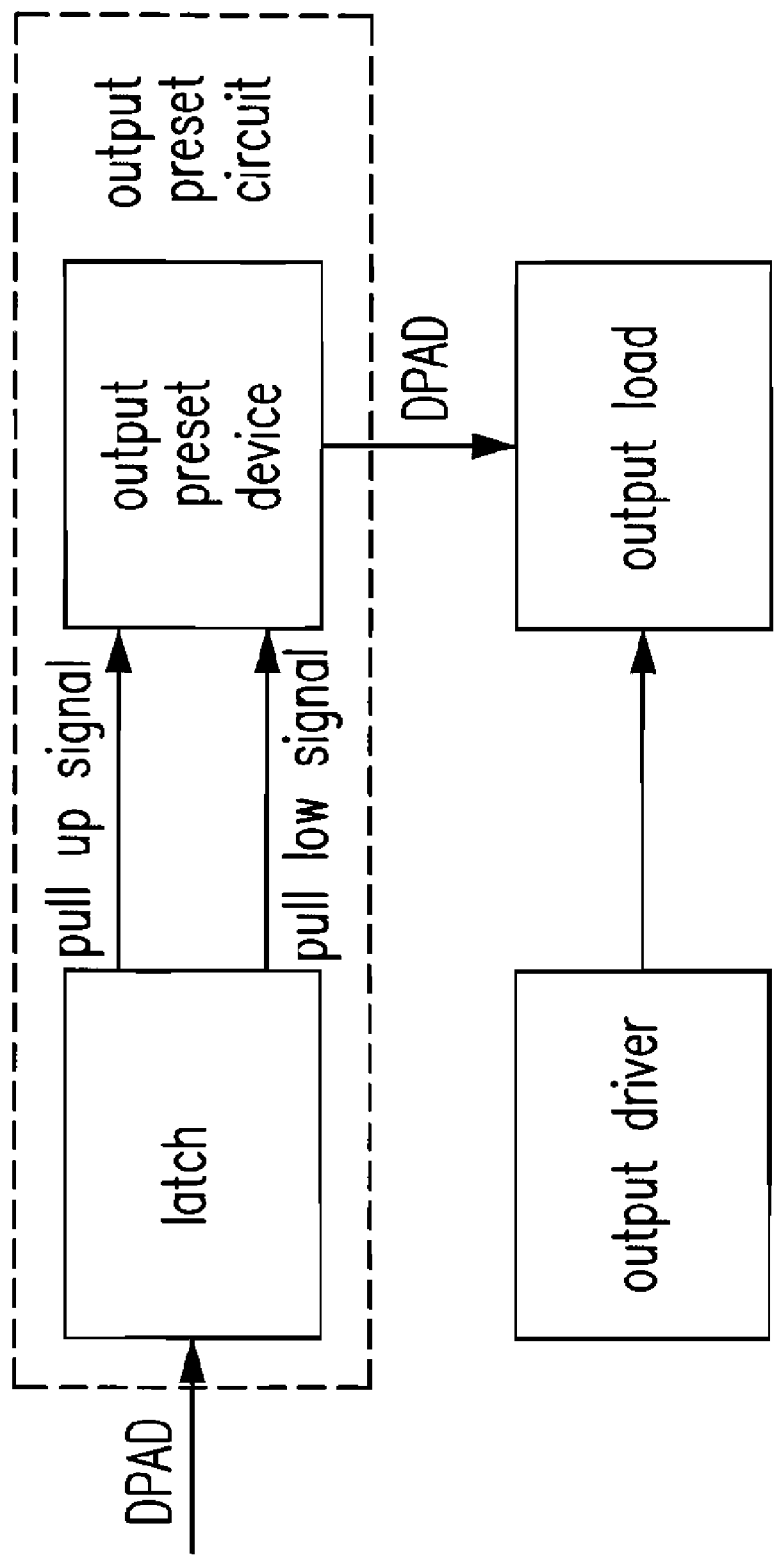
FIG. 2 shows a block diagram of an output driver circuit of the present invention.

Please refer to FIG. 2, which shows a block diagram of an output driver circuit of the present invention. The provided output driver circuit of the present invention includes an output preset circuit, an output driver, and an output load. The output preset circuit includes a latch, which receives a voltage of the output load, DPAD, and generates a pull up signal and a pull low signal, and an output preset device, which is in one of the first status that it receives the pull up signal and pulls up the voltage of the output load, DPAD, from a ground level (e.g., GND(0)) to a first level (e.g., a difference between a power voltage and a threshold voltage of a NMOS, $V_{dd}-V_{TN}$) and a second status that it receives the pull low signal and pulls low the voltage of the output load, DPAD from a power voltage (e.g., $V_{dd}$) to a second level (e.g., $V_{TP}$, where $V_{TP}$ is a threshold voltage of a PMOS) during a preset on phase. The output driver is employed to pull up the voltage of the output load either from the first level to the power voltage level or from the second level to the ground level during an output on phase. Among the elements of the provided output driver circuit, the latch could be any type of latch, e.g., a D-latch and a D-FF, the output driver could be any type of output driver, e.g., an output buffer, and the output load could be any type of output load, e.g., a capacitor.

Figure 3A:
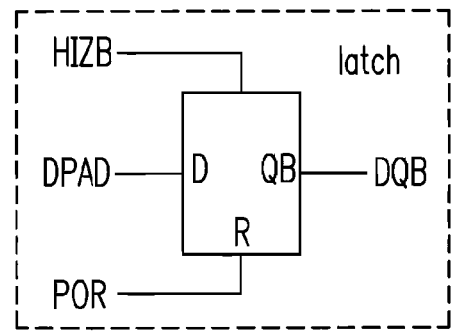
FIG. 3(a) shows a schematic circuit diagram of a latch for an output preset circuit of an output driver circuit according to the first and the second preferred embodiments of the present invention.

In FIG. 3(a), it shows a schematic circuit diagram of a latch for an output preset circuit of an output driver circuit according to the first and the second preferred embodiments of the present invention. The latch has a first input terminal for receiving a power on reset signal POR, a second input terminal for receiving a voltage of the output load DPAD, a third input terminal for receiving an internal output enable signal HIZB and an output terminal for generating a latch output signal DQB. The latch output signal DQB is initialized into a high level through a trigger of the power on reset signal POR set at a high level.

Figure 3B:
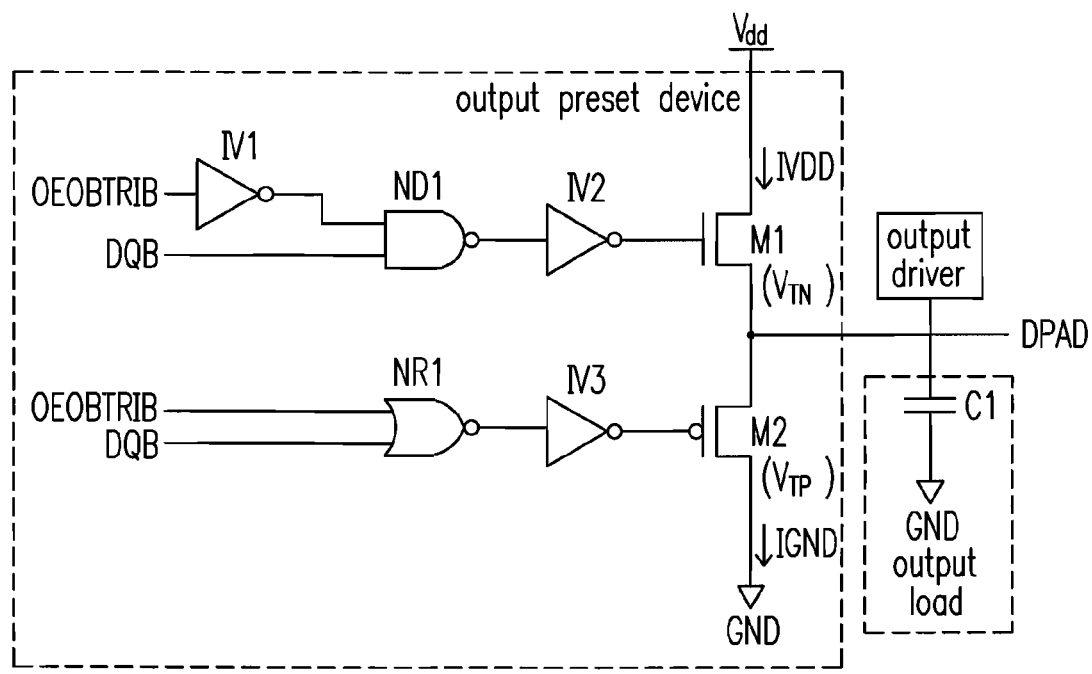
FIG. 3(b) shows a schematic circuit diagram of an output preset device, an output driver and an output load for an output driver circuit according to the first preferred embodiment of the present invention.

Please refer to FIG. 3(b), which shows a schematic circuit diagram of an output preset device, an output driver and an output load for an output driver circuit according to the first preferred embodiment of the present invention. The provided output driver circuit according to the first preferred embodiment of the present invention includes an output preset circuit, an output driver, and an output load. In which, the output driver is coupled to the output load, and the output preset circuit includes the latch as shown in FIG. 3(a) and an output preset device. The output load is a capacitor C1 and has a first terminal and a second terminal coupled to a ground GND. The output preset device includes a pull-up circuit including a first inverter IV1 having an input terminal for receiving an preset enable signal OEOBTRIB and an output terminal, a NAND gate ND1 having a first input terminal coupled to the output terminal of the first inverter IV1, a second input terminal for receiving the latch output signal DQB and an output terminal, a second inverter IV2 having an input terminal coupled to the output terminal of the NAND gate ND1 and an output terminal, and a first switch M1 (an NMOS) having a first terminal for receiving the power voltage $V_{dd}$, a second terminal coupled to the first terminal of the output load C1 and a control terminal coupled to the output terminal of the second inverter IV2, and a pull-low circuit including a NOR gate NR1 having a first terminal for receiving the preset enable signal OEOBTRIB, a second terminal for receiving the latch output signal DQB, and an output terminal, a third inverter IV3 having an input terminal coupled to the output terminal of the NOR gate NR1 and an output terminal, and a second switch M2 having a first terminal coupled to the first terminal of the output load C1, a second terminal coupled to the ground GND and a control terminal coupled to the output terminal of the third inverter IV3. The pull up and the pull low signals are shown in FIG. 2, and each of which includes the preset enable signal OEOBTRIB and the latch output signal DQB.

In FIG. 3(b), the pull-up circuit increases the voltage of the output load DPAD from a ground level (GND(0)) to the first level (e.g., a difference between the power voltage and the threshold voltage of the NMOS: $V_{dd}-V_{TN}$) when the preset enable signal OEOBTRIB is at a low level and the latch output signal DQB is at the high level, and the pull-low circuit decreases the voltage of the output load DPAD from the power voltage $V_{dd}$ to the second level (e.g., $V_{TP}$, $V_{TP}$ is the threshold voltage of a PMOS) when the preset enable signal OEOBTRIB and the latch output signal DQB are both at the low level. Besides, the voltage of the output load DPAD begins to increase from the first level $V_{dd}-V_{TN}$ to the power voltage level $V_{dd}$ via the output driver when the preset enable signal OEOBTRIB is inactive, the latch output signal DQB is at the high level, and the internal output enable signal HIZB is active, and the voltage of the output load begins to decrease from the second level $V_{TP}$ to a ground level GND(0) via the output driver when the preset enable signal OEOBTRIB is at the high level, the latch output signal DQB is at the low level, and the internal output enable signal HIZB is active. Furthermore, the latch output signal DQB switches from the high level to the low level when the voltage of the output load DPAD reaches the power voltage $V_{dd}$ and the internal output enable signal HIZB is active, and the latch output signal DQB switches from the low level to the high level when the voltage of the output load DPAD reaches the ground level GND(0) and the internal output enable signal HIZB is active. Power on reset signal and preset enable signal may be low active or high active by designer's definition. In this embodiment, the preset enable signal OEOBTRIB is active in low voltage level, and inactive in high voltage level.

Figure 3C:
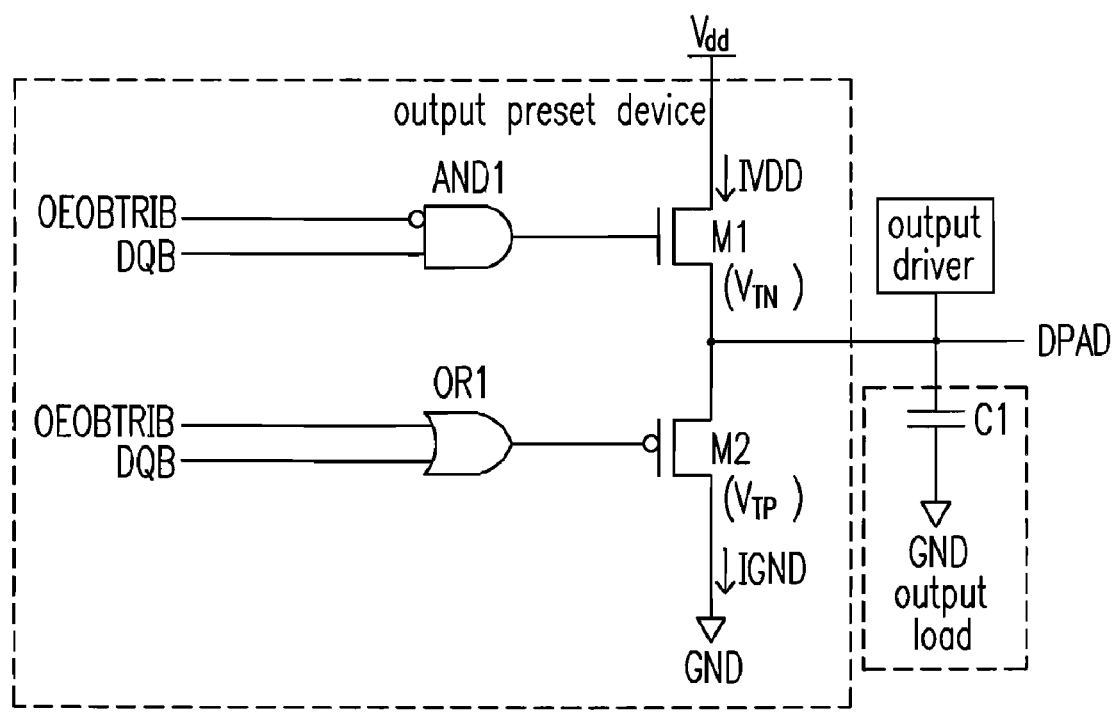
FIG. 3(c) shows a schematic circuit diagram of an output preset device, an output driver and an output load for an output driver circuit according to the second preferred embodiment of the present invention.

Please refer to FIG. 3(c), which shows a schematic circuit diagram of an output preset device, an output driver and an output load all for an output driver circuit according to the second preferred embodiment of the present invention. In which, the AND gate AND1, which has an enable terminal, an input terminal and an output terminal, is an equivalent circuit of the NAND gate ND1, the first inverter IV1 and the second inverter IV2 as shown in FIG. 3(b), the OR gate OR1 is an equivalent circuit of the NOR gate NR1 and the third inverter IV3 as shown in FIG. 3(b), and the remaining part of FIG. 3(c) is the same as that of FIG. 3(b). Also, the operational principles of the output preset circuit as shown in FIG. 3(a) and FIG. 3(c) are the same as those of the output preset circuit as shown in FIG. 3(a) and FIG. 3(b).

Figure 4A:
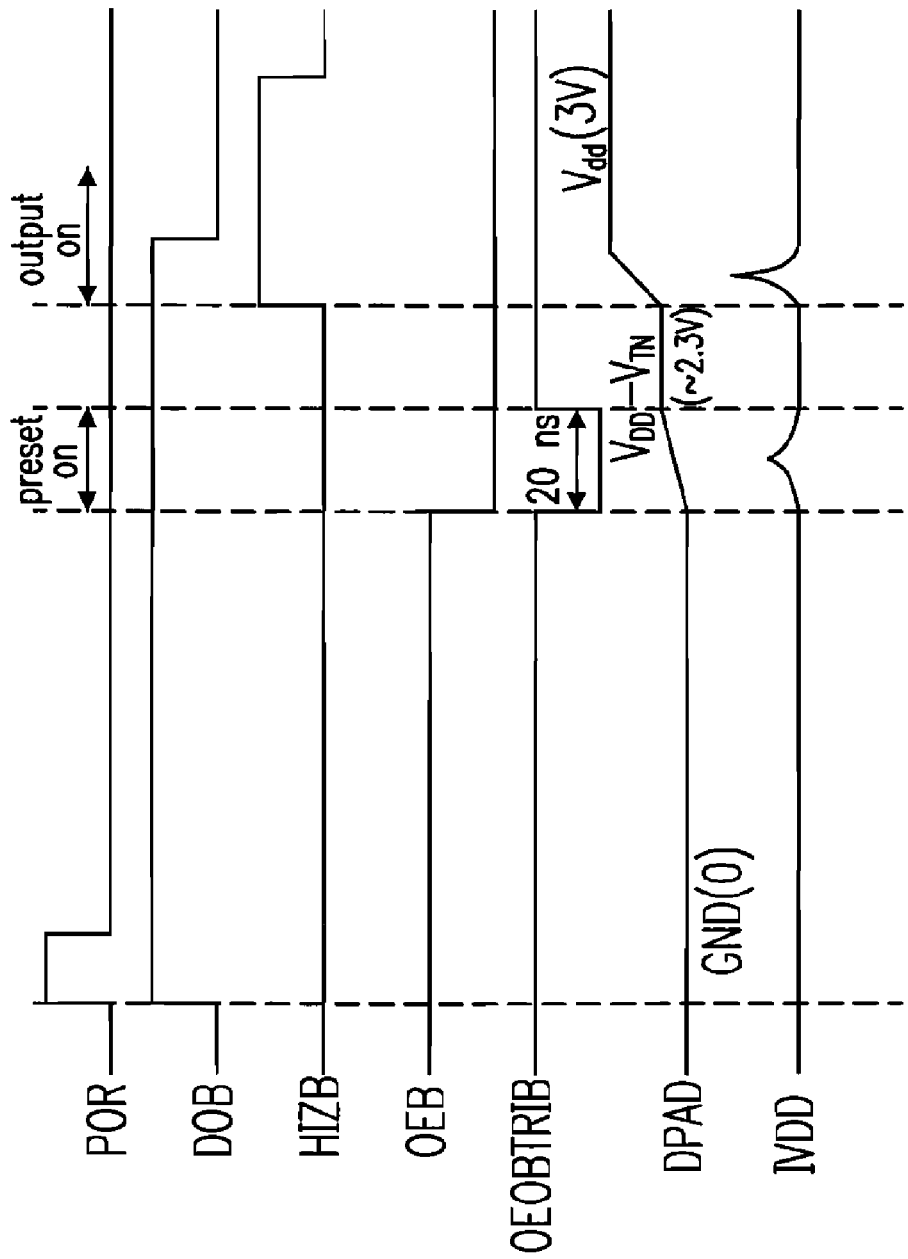
FIG. 4(a) shows a waveform diagram of the power on reset signal, the latch output signal, the internal output enable signal, the external output enable signal, the preset enable signal, the voltage of the output load and the current flowing through $V_{dd}$ vs. time according to the first and the second preferred embodiments of the present invention respectively.

Referring to FIG. 4(a), which shows a waveform diagram of the power on reset signal, POR, the latch output signal, DQB, the internal output enable signal, HIZB, the external output enable signal, OEB, the preset enable signal OEOBTRIB, the voltage of the output load, DPAD, and the current flowing through $V_{dd}$, IVDD, vs. time according to the first and the second preferred embodiments of the present invention respectively. In which, the latch output signal DQB is initialized into a high level through a trigger of the power on reset signal POR set at a high level, the latch output signal, DQB, is switched from the high level to the low level when the voltage of the output load DPAD reaches the power voltage level $V_{dd}$ and the internal output enable signal, HIZB, is active, and the latch output signal, DQB, is switched from the low level to the high level when the voltage of the output load DPAD reaches the ground level and the internal output enable signal, HIZB, is active, the internal output enable signal, HIZB, is switched from inactive to active when the output on phase is on, and is switched from a high level to a low level when the output on phase is ended, the preset enable signal, OEOBTRIB, goes from inactive to active when an external output enable signal, OEB, goes low, maintains at the low level for a predetermined time period (e.g., 20 ns), and goes back to the high level after that time period so as to preset the voltage of the output load, DPAD, the DPAD curve shows that the voltage of the output load is pulled up from a ground level, GND(0), to a first level, a difference between the power voltage and the threshold voltage of an NMOS, $V_{dd}-V_{TN}$, during a preset on phase via the output preset device firstly and from the first level to a power voltage level, $V_{dd}$, during an output on phase via the output driver secondly. Wherein, the preset on phase is lasting for the predetermined period (e.g., 20 ns in this case), the $V_{TN}$ is approximately 0.7V, and the $V_{dd}$ equals to 3V. IVDD is the current flows through the NMOS M1 (with a threshold voltage $V_{TN}$) and the output load, and the curve of IVDD shows two ripples.

Figure 4B:
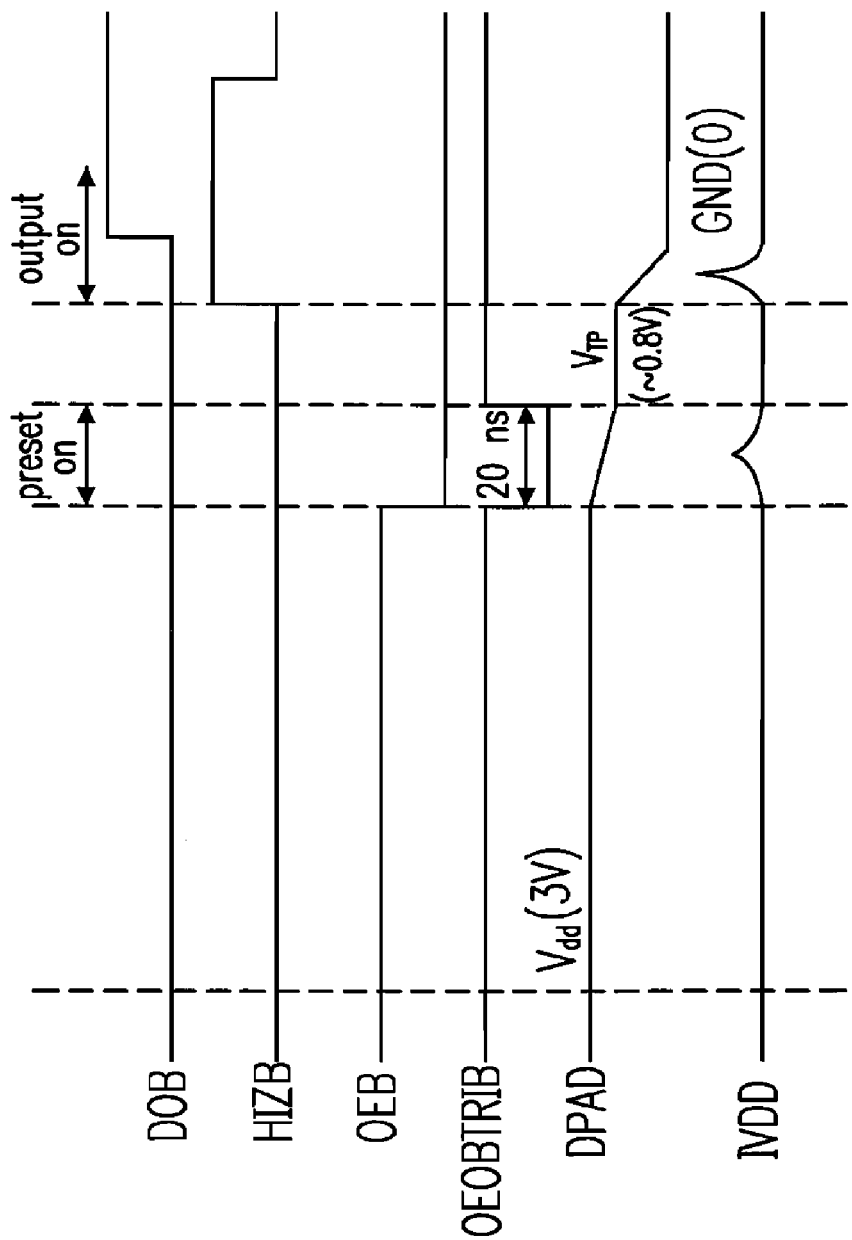
FIG. 4(b) shows a waveform diagram of the latch output signal, the internal output enable signal, the external output enable signal, the preset enable signal, the voltage of the output load, and the current flowing through GND vs. time according to the first and the second preferred embodiments of the present invention respectively.

In FIG. 4(b), which shows a waveform diagram of the latch output signal, DQB, the internal output enable signal, HIZB, the external output enable signal, OEB, the preset enable signal OEOBTRIB, the voltage of the output load, DPAD, and the current flowing through GND, IGND, vs. time according to the first and the second preferred embodiments of the present invention respectively. In which, the DPAD curve shows that the voltage of the output load is pulled low from $V_{dd}$ to a second level, i.e. $V_{TP}$, via the output preset circuit firstly and from the second level to the ground level, GND(0), via the output driver secondly. IGND is the current flows through the output load and the PMOS M2 (with a threshold voltage $V_{TP}$), and the curve of IGND also shows two ripples.

In conclusion, the provided output driver circuit such as an output buffer circuit with an output preset circuit achieves the advantages of having high read out speed, low switching noise and lower power consumption.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. An output preset circuit for an output buffer, comprising:
    a latch having a first input terminal receiving a power on reset signal, a second input terminal receiving a voltage of the output buffer, a third input terminal receiving an internal output enable signal and an output terminal outputting a latch output signal; and
    an output preset device, comprising:
        a pull-up circuit receiving a preset enable signal and the latch output signal, wherein the pull-up circuit increases the voltage of the output buffer from a ground level to a first level when the preset enable signal is active and the latch output signal is at the high level; and
        a pull-low circuit receiving the preset enable signal and the latch output signal, wherein the pull-low circuit decreases the voltage of the output buffer from a power voltage level to a second level when the preset enable signal is active and the latch output signal is at the low level, and the first level and the second level are between the power voltage level and the ground level.

2. An output preset circuit according to claim 1, wherein the output buffer further connects an output load and comprises an output driver, and the output load has a first terminal and a second terminal coupled to a ground.

3. An output preset circuit according to claim 2, wherein the pull-up circuit comprises a first inverter having an input terminal receiving the preset enable signal and an output terminal, a NAND gate having a first input terminal coupled to the output terminal of the first inverter, a second input terminal receiving the latch output signal and an output terminal, a second inverter having an input terminal coupled to the output terminal of the NAND gate and an output terminal, and a first switch having a first terminal receiving a power voltage, a second terminal coupled to the first terminal of the output load and a control terminal coupled to the output terminal of the second inverter.

4. An output preset circuit according to claim 3, wherein the pull-low circuit comprises a NOR gate having a first input terminal receiving the preset enable signal, a second input terminal receiving the latch output signal, and an output terminal, a third inverter having an input terminal coupled to the output terminal of the NOR gate and an output terminal, and a second switch having a first terminal coupled to the first terminal of the output load, a second terminal coupled to the ground and a control terminal coupled to the output terminal of the third inverter.

5. An output preset circuit according to claim 4, wherein the first switch is an NMOS, the second switch is a PMOS, the NMOS is turned on when the preset enable signal is at the high level and the latch output signal is at the high level, the PMOS is turned on when the preset enable signal is at the low level and the latch output signal is at the low level, the first level equals to a difference between the power voltage and a threshold voltage of the NMOS, and the second level equals to a threshold voltage of the PMOS.

6. An output preset circuit according to claim 2, wherein the output driver causes a voltage of the output load to increase from the first level to the power voltage level when the preset enable signal is inactive, the latch output signal is at the high level, and the internal output enable signal is active, and the output driver causes the voltage of the output load to decrease from the second level to the ground level when the preset enable signal is inactive, the latch output signal is at the low level, and the internal output enable signal is active.

7. An output preset circuit according to claim 6, wherein the latch output signal at the high level is switched to the low level when the voltage of the output load reaches the power voltage level and the internal output enable signal is active, and the latch output signal at the low level is switched to the high level when the voltage of the output load reaches the ground level and the internal output enable signal is active.

8. An output preset circuit according to claim 6, wherein the output driver outputs a data via the output load, and the preset enable signal goes from inactive to active when an external output enable signal goes low, maintains at active for a predetermined time period, and goes back to inactive after the predetermined time period so as to preset the voltage of the output load.

9. An output preset circuit according to claim 1, wherein the output buffer further connects an output load having a first terminal and a second terminal coupled to a ground.

10. An output preset circuit according to claim 9, wherein the pull-up circuit comprises an AND gate having an enable terminal receiving an preset enable signal, an input terminal receiving the latch output signal and an output terminal, a first switch having a first terminal receiving a power voltage, a second terminal coupled to the first terminal of the output load and a control terminal coupled to the output terminal of the AND gate.

11. An output preset circuit according to claim 10, wherein the pull-low circuit comprises an OR gate having a first input terminal receiving the preset enable signal, a second input terminal receiving the latch output signal and an output terminal, a second switch having a first terminal coupled to the first terminal of the output load, a second terminal coupled to the ground and a control terminal coupled to the output terminal of the OR gate.

12. An output preset circuit according to claim 9, wherein the output buffer further comprises an output driver causes a voltage of the output load to increase from the first level to the power voltage level when the preset enable signal is inactive, the latch output signal is at the high level, and the internal output enable signal is active, and the output driver causes the voltage of the output load to decrease from the second level to the ground level when the preset enable signal is inactive, the latch output signal is at the low level, and the internal output enable signal is active.

13. A controlling method for an output driver circuit, wherein the output driver circuit connects an output load and comprises an output preset circuit having a latch, and the latch generates an output signal, comprising the steps of:
    (a) activating a preset enable signal so as to preset a voltage of the output load to be one of a first level increased from a ground level and a second level decreased from a power voltage level, wherein the first level and the second level are between the power voltage level and the ground level;

(b) increasing the voltage of the output load to a high level when the output signal of latch is at the high level;

(c) decreasing the voltage of the output load to a low level when the output signal of latch is at the low level; and (d) increasing the voltage of the output load from the first level to the power voltage level when the preset enable signal is inactive, the latch output signal is at a high level, and an internal output enable signal received by the latch is active.

14. A controlling method according to claim 13, further comprising a step of: (e) decreasing the voltage of the output load from the second level to the ground level when the preset enable signal is inactive, the latch output signal is at a low level, and the internal output enable signal is active.

15. A controlling method according to claim 14, wherein the step (d) further comprises a step of (d1) switching the latch output signal from the high level to the low level when the voltage of the output load reaches the power voltage level and the internal output enable signal is active and step (e) further comprises a step of (e1) switching the latch output signal from the low level to the high level when the voltage of the output load reaches the ground level and the internal output enable signal is active.

16. A controlling method according to claim 13, wherein the output preset circuit further comprises a first switch and a second switch and the step (a) further comprises the steps of:

(a1) switching the preset enable signal from inactive to active when an external output enable signal goes low, maintains at active for a predetermined time period, and goes back to inactive after the predetermined time period so as to preset the voltage of the output load;

(a2) turning the first switch on and the second switch off when the latch output signal is at the high level such that the voltage of the output load is increased from the ground level to the first level; and (a3) turning the first switch off and the second switch on when the latch output signal is at the low level such that the voltage of the output load is decreased from the power voltage level to the second level.

17. A controlling method according to claim 16, wherein the first switch is an NMOS, the second switch is a PMOS, the first level equals to a difference between the power voltage and a threshold voltage of the NMOS, and the second level equals to a threshold voltage of the PMOS.

* * * * *